US012606896B2

(12) United States Patent
Glavin et al.

(10) Patent No.: US 12,606,896 B2
(45) Date of Patent: Apr. 21, 2026

(54) PROCESS OF MAKING COMPONENTS FOR ELECTRONIC AND OPTICAL DEVICES USING LASER PROCESSING INCLUDING ABLATION

(71) Applicant: Government of the United States, as represented by the Secretary of the Air Force, Wright-Patterson AFB, OH (US)

(72) Inventors: Nicholas R. Glavin, Springboro, OH (US); Philip R. Buskohl, Beavercreek, OH (US); Kimberly A. Gliebe, Mentor, OH (US); Christopher Muratore, Kettering, OH (US); Drake Austin, Beavercreek, OH (US)

(73) Assignee: United States of America as represented by Secretary of the Air Force, Wright-Patterson AFB, OH (US)

( * ) Notice: Subject to any disclaimer, the term of this patent is extended or adjusted under 35 U.S.C. 154(b) by 1259 days.

(21) Appl. No.: 17/336,855

(22) Filed: Jun. 2, 2021

(65) Prior Publication Data

US 2021/0301381 A1      Sep. 30, 2021

Related U.S. Application Data

(63) Continuation-in-part of application No. 17/216,729, filed on Mar. 30, 2021.

(Continued)

(51) Int. Cl.
*C22F 1/00*          (2006.01)
*H01L 21/02*        (2006.01)
(Continued)

(52) U.S. Cl.
CPC .............. *C22F 1/00* (2013.01); *H01L 21/428* (2013.01); *H01L 21/463* (2013.01); *H01L 21/02675* (2013.01); *H01L 21/324* (2013.01)

(58) Field of Classification Search
CPC ............. H01L 21/324; H01L 21/02675; H01L 21/428
See application file for complete search history.

(56) References Cited

U.S. PATENT DOCUMENTS 3,138,743 A      6/1964  Kilby
5,515,241 A      5/1996  Werther
(Continued)

OTHER PUBLICATIONS

Castellanos-Gomez et al. ("Laser-thinning of MoS2: On-Demand Generation of a Single-Layer Semiconductor." Nano Letters. vol. 12, No. 6, 3187-3192 (2012). (Year: 2012).*
(Continued)

*Primary Examiner* — Yara B Green
*Assistant Examiner* — Erika H Son
(74) *Attorney, Agent, or Firm* — AFMCLO/JAZ; Jeffrey V. Bamber; James F. McBride

(57) ABSTRACT

The present invention relates to processes of making components for electronic and optical devices using laser processing and devices comprising such components. Such process uses a laser to introduce chemical and/or structural changes in substrates and films that are the raw materials from which components for electronic and optical devices are made. Such process yields components that can have one or more electronic and/or optical functionalities that are integrated on the same substrate or film. In addition, such process does not require large-scale clean rooms and is easily configurable. Thus, rapid device prototyping, design change and evolution in the lab and on the production side is realized.

20 Claims, 6 Drawing Sheets

Related U.S. Application Data

(60) Provisional application No. 63/001,604, filed on Mar. 30, 2020.

(51) Int. Cl.
| | |
|---|---|
| *H01L 21/324* | (2006.01) |
| *H01L 21/428* | (2006.01) |
| *H01L 21/463* | (2006.01) |

(56) References Cited

U.S. PATENT DOCUMENTS

| | | | |
|---|---|---|---|
| 5,526,280 A | 6/1996 | Consadori et al. | |
| 10,429,381 B2 | 10/2019 | Hoffman | |
| 10,770,483 B2 * | 9/2020 | Sugawara | H10D 30/6756 |
| 10,875,339 B1 | 12/2020 | Claussen | |
| 11,469,351 B2 * | 10/2022 | Li | H10F 77/12 |
| 12,123,845 B2 | 10/2024 | Mahjouri-Samani | |
| 2006/0246632 A1 | 11/2006 | Okumura | |
| 2012/0043546 A1 | 2/2012 | Oh et al. | |
| 2018/0308692 A1 * | 10/2018 | Muratore | H01L 21/02631 |
| 2020/0090933 A1 | 3/2020 | Muratore | |
| 2021/0299781 A1 | 9/2021 | Glavin et al. | |
| 2021/0299789 A1 | 9/2021 | Glavin et al. | |
| 2021/0313188 A1 | 10/2021 | Glavin et al. | |
| 2021/0325380 A1 | 10/2021 | Muthukumar | |
| 2022/0140147 A1 | 5/2022 | Choe | |
| 2022/0270891 A1 | 8/2022 | Currie | |
| 2023/0045818 A1 | 2/2023 | Glavin et al. | |
| 2023/0148461 A9 | 5/2023 | Glavin et al. | |
| 2023/0152309 A9 | 5/2023 | Glavin et al. | |

OTHER PUBLICATIONS

"Mine, H. et al., Laser-Beam-Patterned Topological Insulating States on Thin Semiconducting MoS2," Oct. 2, 2019, American Physical Society, vol. 123, p. 146803 (Year: 2019).*

"Tan, Y. et al., Controllable 2H-to-1T' Phase Transition in Few-Layer MoTe2," Oct. 10, 2018, Royal Society of Chemistry, 10, pp. 19964-70 (Year: 2018).*

Kang et al. ("Controllable atomic-ratio of CVD-grown MoS2-MoO2 hybrid catalyst by soft annealing for enhancing hydrogen evolution reaction." International Journal of Hydrogen Energy, 45, 1399-1408 (2020). DOI: 10.1016/j.ijhydene.2019.11.066). (Year: 2019).*

Mcconny, M.E. et al.; "Direct synthesis of ultra-thin large area transition metal dichalcogenides and their heterostructures on stretchable polymer surfaces," J. of Mat. Res., 2016, 0, 0, 1-8.

Sirota, B. et al. "Room temperature magnetron sputtering and laser annealing of ultrathin MoS2 for flexible transistors," Vacuum, 2019, 160, 133-138.

Kim, R. H. et al.; "Photonic Crystallization of MoS2 for Stretchable Photodetectors," Nanoscale, 2019, 11, 13260-13268.

Galvin, N. R.; IEEE Presentation Rapid Conference in Miramar Beach, FL. Aug. 20, 2019, 1-44.

Ahmadi, Z. et al "Self-limiting laser crystallization and direct writing of 2D materials" Int. J. Extrem. Manuf. 2019, 1, 015001, 1-8.

Vilá, R. A. . et al "In situ crystallization kinetics of two-dimensional MoS2" 2D Mater. 5 2018, 5, 011009, 1-8.

Muratore, C. "Biofunctionalized Two-dimensional MoS2 Receptors for Rapid Response Modular Electronic SARS-CoV-2 and Influenza A Antigen Sensors" medrxivorg., Nov. 20, 2020, 1-11.

Muratore, C. "Beyond point of care diagnostics: Lowdimensional nanomaterials for electronic virus sensing" J. Vac. Sci. Technol. A 2020, 38, 050804, 1-16.

U.S. Appl. No. 17/216,729, filed Nov. 25, 2024 Non-final Rejection.

Mine, H.; Kobayashi, A.; Nakamura, T.; Inoue, T.; Pakdel, S.; Marian, D.; Gonzalez-Marin, E.; Maruyama, S.; Katsumoto, S.; Fortunelli, A.; Palacios, J.J.; Haruyama, J.; Laser-Beam-Patterned Topological Insulating States on Thin Semiconducting MoS2 2019, Physical Review Letters 123, 146803.

Tan, Y.; Luo, F.; Zhu, M.; Xu, X.; Ye, Y.; Li, B.; Wang, G.; Luo, W.; Zheng, X.; Wu, N.; Yu, Y.; Qin, S.; Zhang, X.; Controllable 2H-to-1T' phase transition in few-layer MoTe2 Nanoscale 2018, 10, 19964-19971.

PCT International Search Report for PCT/US22/20850.

PCT Written Opinion of The International Searching Authority for PCT/US22/20850.

PCT International Search Report for PCT/US22/20853.

PCT Written Opinion of The International Searching Authority for PCT/US22/20853.

PCT International Search Report for PCT/US22/20854.

PCT Written Opinion of The International Searching Authority for PCT/US22/20854.

Austin Drake et al: "Laser writing of electronic circuitry in thin film molybdenum disulfide: A transformative manufacturing approach", Materials Today 2020, 43, pp. 17-26.

Yi Rang Lim et al: "Roll-to-Roll Production of Layer-Controlled Molybdenum Disulfide: A Platform for 2D Semiconductor-Based Industrial Applications", Advanced Materials, 2018, 30,1705270, pp. 1-8.

Rai Rachel H et al: "Pulsed laser annealing of amorphous two-dimensional transition metal dichalcogenides" J. Vac. Sci. Technol. 2020, A 38, 052201, pp. 1-7.

PCT International Search Report for PCT/US22/20851.

PCT Written Opinion of The International Searching Authority for PCT/US22/20851.

U.S. Appl. No. 17/216,729, filed Apr. 21, 2025 Final Rejection.

U.S. Appl. No. 17/336,799, filed Mar. 31, 2025 Non-final Rejection.

U.S. Appl. No. 17/523,705, filed Jun. 5, 2025 Non-final Rejection.

U.S. Appl. No. 17/523,721, filed Apr. 15, 2025 Non-final Rejection.

U.S. Appl. No. 17/957,293, filed Apr. 15, 2025 Non-final Rejection.

Supplemental information for Kukkar, et al. "A New Electrolytic Synthesis Method for Few Layered MoS2 Nanosheets and Their Reduced Antibodies", ACS Applied Materials & Interfaces, 8, 16555-16563 (2016). DOI: 10.1021/acsami.6b03079. (Year: 2016).

Zhang, et al. "Protocell arrays for simulatneous detection of diverse analytes", Nat Commun 12, 5724 (2001). DOE: 10.1038/s41467-021-25989-3. (Year: 2021).

Lee, et al. "Two-dimensional Layered MoS2 Biosensors Enable Highly Sensitive Detection of Biomolecules", Sci Rep 4, 7352 (2014). DOI: 10.1038/srep07352. (Year: 2014).

Windom, et al. "A Raman Spectroscopic Study of MoS2 and MoO3: Applications to Tribological Systems", Tribol Lett 42, 301-310 (2011). DOI: 10.1007/s11249-011-9774-x) (Year: 2011).

Lu, et al., "Layer-by-layer thinning of MoS2 by thermal annealing", Nanoscale 5, 8904-8908 (2013). DOI: 10.1039/c3nr03101b (Year: 2013).

Li, et al., "The Stability of Metallic MoS2 Nanosheets and Their Property Change by Annealing", Nanomaterials, 9, 1366 (2019). DOI: 10.3390/nano9101366. (Year: 2019).

Kang, et al., "High-performance MoS2 transistors with low-resistance molybdenum contacts", Applied Physics Letters 104, 093106 (2014). DOI: 10.1063/1.4866340. (Year: 2014).

U.S. Appl. No. 17/336,799, filed Mar. 3, 2025 Non-final Rejection.

Kukkar et al. ("A New Electrolytic Synthesis Method for Few Layered MoS2 Nanosheets and Their Robust Biointerfacing With Reduced Antibodies." ACS Applied Materials & Interfaces, 8, 16555-16563 (2016). DOI: 10.1021/acsami.6b03079).

U.S. Appl. No. 17/336,855, filed Sep. 12, 2025 Non-final Rejection.

U.S. Appl. No. 17/523,705, filed Oct. 31, 2025 Final Rejection.

U.S. Appl. No. 17/957,293, filed Nov. 28, 2025 Final Rejection.

Naylor et al. ("Scalable Production of Molybdenum Disulfide Based Biosensors." ACS Nano, 10(6), 6173-6179 (2016). DOI: 10.1021/acsnano.6b02137). (Year: 2016).

Rajeev et al. ("Laser patterned polymer/nanotube composite electrodes for nanowire transistors on flexible substrates." arXiv: Applied Physics (2017). DOI: 10.48550/arXiv.1711.06925). (Year: 2017).

Li et al. ("Fibroin-like Peptides Self-Assembling on Two-Dimensional Materials as a Molecular Scaffold for Potential Biosensing." ACS Applied Materials & Interfaces, 11, 20670-20677 (2019). DOI: 10.1021/acsami.9b04079). (Year: 2019).

Wells et al. ("Roll-to-Roll Deposition of Semiconducting 20 Nanoflake Films of Transition Metal Dichalcogenides for Optoelectronic Appli-

(56)            References Cited

OTHER PUBLICATIONS cations." ACS Appl. Nano Mater., 2, 7705-7712 (2019). DOI: 10.1021/acsanm.9b01774). (Year: 2019).
Park et al. ("Laser-directed synthesis of strain-induced crumpled MoS2 structure for enhanced triboelectrification toward haptic sensors." Nano Energy, 78, 105266 (2020). DOI: 10.1016/j.nanoen. 2020.105266). (Year: 2020).

* cited by examiner

1

PROCESS OF MAKING COMPONENTS FOR ELECTRONIC AND OPTICAL DEVICES USING LASER PROCESSING INCLUDING ABLATION

CROSS-REFERENCE TO RELATED APPLICATION

The present application is a continuation-in-part of U.S. patent application Ser. No. 17/216,729 filed Mar. 30, 2021, which in turn claims priority to U.S. Provisional Application Ser. No. 63/001,604 filed Mar. 30, 2020, the contents of U.S. patent application Ser. No. 17/216,729 and U.S. Provisional Application Ser. No. 63/001,604 hereby incorporated by reference in its entry.

RIGHTS OF THE GOVERNMENT

The invention described herein may be manufactured and used by or for the Government of the United States for all governmental purposes without the payment of any royalty.

FIELD OF THE INVENTION

The present invention relates to processes of making components for electronic and optical devices using laser processing and devices comprising such components.

BACKGROUND OF THE INVENTION

Device elements (e.g. resistors, capacitors, diodes, sensors, MOSFETs and bipolar junction transistors) within circuits rely on controlling the electron transport within three basic building blocks of electronic materials: insulators, conductors, and semiconductors. It is only through the precise and tedious integration of these three subsets of materials that we realize electronics, as we know them today. Current methods of making components for electronic and optical devices require large-scale clean rooms and are not easily reconfigurable. As a result, rapid device prototyping, design change and evolution is not only difficult in the lab but also prohibitive on the production side. As a result, industry has looked to additive manufacturing processes for a solution. Unfortunately, reproducibility, ink stability, and material limitations remain as barriers to an additive manufacturing solution. In addition to the aforementioned problems, current methods of making components for electronic and optical devices are limited to producing primarily single function components that are later assembled with other components to yield the desired electronic and/or optical functionality. Thus, what is needed is an efficient, easily reconfigurable process of making components for electronic and optical devices that not only can yield single function components but also can yield components with multiple functions that are integrated on the same substrate or film.

Applicants recognized that lasers could not only be used to remove material from substrates and films but could also be used to induce chemical and/or structural changes in substrates and films with distinct electronic properties. Such recognition lead Applicants to develop a process of making components for electronic and optical devices, devices that can have one or more electronic and/or optical functionalities. Importantly, Applicants process can be used to make structural and/or chemical changes within a film or other article that results in an electrical component, an optical component or a combined electrical and optical component being created in such film or article. Such process does not require large-scale clean rooms and is easily configurable. Thus, rapid device prototyping, design change and evolution in the lab and on the production side are realized.

SUMMARY OF THE INVENTION

The present invention relates to processes of making components for electronic and optical devices using laser processing and devices comprising such components. Such process uses a laser to introduce chemical and/or structural changes and/or removal of material through ablation or similar laser removal processes in substrates and films that are the raw materials from which components for electronic and optical devices are made. Such process yields components that can have one or more electronic and/or optical functionalities that are integrated on the same substrate or film. In addition, such process does not require large-scale clean rooms and is easily configurable. Thus, rapid device prototyping, design change and evolution in the lab and on the production side is realized.

Additional objects, advantages, and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF THE INVENTION

Definitions

Figures 1A, 1B, 1C:
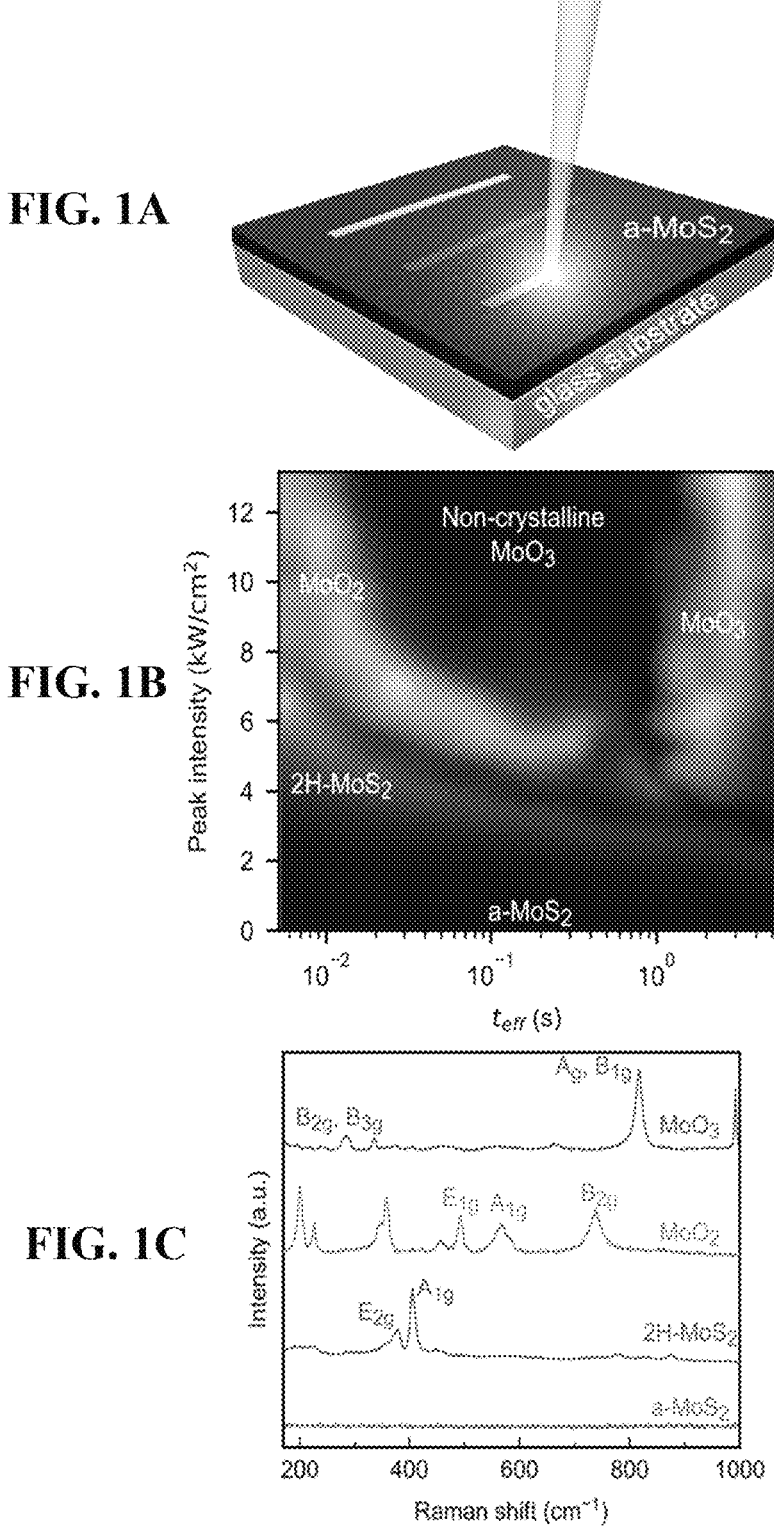
FIG. 1A is a schematic depicting a continuous wave laser beam forming patterned structures onto a 900 nm thick amorphous $MoS_2$ film on a glass substrate.
FIG. 1B is a processing diagram describing the chemistry and crystalline intensity of areas exposed to a given laser peak intensity ($kW/cm^2$) and effective exposure time.
FIG. 1C are Raman spectrographs of the various crystalline films.

Unless specifically stated otherwise, as used herein, the terms "a", "an" and "the" mean "at least one".

As used herein, the terms "include", "includes" and "including" are meant to be non-limiting.

As used herein, the words "about," "approximately," or the like, when accompanying a numerical value, are to be construed as indicating a deviation as would be appreciated by one of ordinary skill in the art to operate satisfactorily for an intended purpose.

As used herein, the words "and/or" means, when referring to embodiments (for example an embodiment having elements A and/or B) that the embodiment may have element A alone, element B alone, or elements A and B taken together.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Process of Making an Electrical Component, an Optical Component or a Combined Electrical and Optical Component For purposes of this specification, headings are not considered paragraphs and thus this paragraph is paragraph twenty-six of the present specification. The individual number of each paragraph above and below this paragraph can be determined by reference to this paragraph's number. In this paragraph twenty-six, Applicants disclose a process of making an electrical component, an optical component or a combined electrical and optical component, said process comprising:

a) pattern illumination-based annealing at a specific intensity and for a specific time, at least one material that comprises two or more regions that are amorphous, nanocrystalline, microcrystalline or crystalline with the proviso that at least two of said regions are not identical with respect being amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof, using a laser or lamp, to form on, within or on and within said material:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

said process being performed under one of the following conditions: vacuum of less 100 torr, air or under a fluid blanket other than air;

said pattern illumination-based annealing resulting in at least one of a chemical change or structural change, and optionally the removal of material, in at least one of said materials that results in an electrical component, an optical component or a combined electrical and optical component being created to form on, within or on and within said material; or b) pattern illumination-based annealing at least one material that comprises at least one region that is amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof, using a laser or lamp, to form on, within or on and within said material:

(i) at least two electronic elements selected from a conductor, semiconductor and an insulator;

(ii) two or more different conductors having at least one of the following: different electrical properties or different optical properties;

(iii) two or more different semiconductors having at least one of the following: different electrical properties or different optical properties; or (iv) two or more different insulators having at least one of the following: different electrical properties or different optical properties;

at least two electronic elements selected from a conductor, semiconductor and an insulator, said process being performed under one of the following environmental conditions: vacuum of less 100 torr, air or under a fluid blanket other than air, then repeating, one or more times said pattern illumination-based annealing on said at least one material using one or more of the following:

(i) the same device but at least one of the following: a different intensity or time;

(ii) a different environmental condition from the previous environmental condition, said different environmental condition select from the same group of environmental conditions; or (iii) a lamp if the previous pattern illumination-based annealing was laser pattern illumination-based annealing or a laser if the previous pattern illumination-based annealing was lamp pattern illumination-based annealing said pattern illumination-based annealing resulting in at least one of a chemical change or structural change, and optionally the removal of material, in at least one of said at least one material's optical or electrical properties.

Applicants disclose the process of paragraph twenty-six wherein for process element 1b) of paragraph twenty-six, said at least one material comprises two or more regions that are amorphous, nanocrystalline, microcrystalline or crystalline with the proviso that at least two of said regions are not identical with respect being amorphous, nanocrystalline, microcrystalline or crystalline, at least two of said regions being pattern illumination-based annealed via different pattern illumination-based annealing processes.

Applicants disclose the process of paragraphs twenty-six through twenty-seven wherein said transition metal is selected from the group consisting of molybdenum, tungsten, niobium, tantalum, vanadium, titanium, chromium, iron, rhodium, hafnium, rhenium and mixtures thereof.

Applicants disclose the process of paragraphs twenty-six through twenty-eight wherein said process is performed under a fluid blanket other than air.

Applicants disclose the process of paragraphs twenty-six through twenty-eight wherein said fluid blanket comprises:
   a) an element selected from the group consisting of krypton, xenon, radon, argon, neon, helium, hydrogen, carbon, nitrogen, oxygen, sulfur, selenium, phosphorous and mixtures thereof,
   b) based on total fluid volume greater than 0% to about 19% or from 21% to 100% oxygen; and/or
   c) greater than 0% to about 78% or from 80% to 100% nitrogen.

Applicants disclose the process of paragraphs twenty-six through thirty wherein said material comprises at least one region that is amorphous or nanocrystalline.

Applicants disclose the process of paragraphs twenty-six through thirty-one wherein, said material comprises one or more chemical coatings, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$, and mixtures thereof.

Applicants disclose the process of paragraphs twenty-six through thirty-one wherein, said material comprises a substrate having a first side and a second side and one or more chemical coatings one or more chemical coatings disposed on said substrate's first side and optionally disposed on said substrate's second side, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$, and mixtures thereof said substrate of said coated substrate being selected from glass, polymer and mixtures thereof, preferably said polymer is selected from the group consisting of polyethylene naphthalate, polyimide, polycarbonate, polyethylene naphthalate and polyethylene terephthalate and mixtures thereof.

Applicants disclose the process of paragraphs twenty-six through thirty-three wherein said pattern illumination-based annealing is achieved by using one or more lasers, said one or more lasers each being independently selected from a laser that is a pulsed laser, a continuous laser or a pulsed/continuous laser. A pulsed continuous laser is a laser that can provide a pulsed laser beam and a continuous laser.

Applicants disclose the process of paragraphs twenty-six through thirty-four wherein said pattern illumination-based annealing is achieved by using a continuous wave laser to subject at least a portion of said material, for a time of about 0.01 milliseconds to 60 seconds to said continuous laser, preferably for a time of about 0.1 milliseconds to 10 seconds to said continuous laser, more preferably for a time of about 1 millisecond to 1 second to said continuous laser; said continuous laser having power of from about 1 microwatt to about 1 megawatt over the time period said at least a portion of said chemical coating is subjected to said continuous laser, preferably said continuous laser having power of from about 0.1 milliwatt to about 1 kilowatt over the time period said at least a portion of said material is subjected to said continuous laser, more preferably said continuous laser having power of from about 1 microwatt to about 500 watts over the time period said at least a portion of said material is subjected to said continuous laser; preferably said portion of material has an area of about 100 square nanometers to about 1 square meter, more preferably said portion of material has an area of about 1 square micrometer to about 1 $cm^2$, most preferably said portion of said material has an area of about 100 square micrometers to about 250,000 square micrometers. Said portion of material may be any geometry including but not limited to rectangular, circular or square. Preferably, said portion of said material is a portion of the material comprising one or more chemical coatings, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$ and mixtures thereof.

Applicants disclose the process of paragraphs twenty-six through thirty-four wherein said pattern illumination-based annealing is achieved by using a lamp to subject at least a portion of said material for a time of about 10 microseconds to about 500,000 microseconds, preferably for a time of about 25 microseconds to about 100,000 microseconds, more preferably for a time of about 50 microseconds to about 1,000 microseconds to said lamp, said lamp having power of from about 0.01 $J/cm^2$ to about 1,000 $J/cm^2$, preferably said lamp having power of from about 0.1 $J/cm^2$ to about 100 $J/cm^2$, more preferably said lamp having power of from about 2 $J/cm^2$ to about 10 $J/cm^2$, preferably said portion of material has an area of about 1 square micrometer to about 50 square meters, more preferably said portion of said material has an area of about 1 square micrometers to about 1 square meter, most preferably said portion of said material has an area of about 10 square micrometers to about 1 cm². Said portion of material may be any geometry including but not limited to rectangular, circular or square Preferably, said portion of said material is a portion of the material comprising one or more chemical coatings, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$ and mixtures thereof.

Applicants disclose the process of paragraphs twenty-six through thirty-four wherein said pattern illumination-based annealing is achieved by using a pulsed laser to subject at least a portion of said material for a time of about 0.1 femtoseconds to 60 seconds to said pulsed laser, preferably for a time of about 0.1 nanoseconds to 1 second to said pulsed laser, more preferably for a time of about 10 nanoseconds to 1 millisecond to said pulsed laser; said pulsed laser having a peak power of from about 0.1 microwatt to about 1000 gigawatts over the time period said at least a portion of said material is subjected to said pulsed laser, preferably said pulsed laser having a peak power of from about 0.1 milliwatt to about 100 megawatts over the time period said at least a portion of said material is subjected to said pulsed laser, more preferably said pulsed laser having a peak power of from about 1 watt to about 50 megawatts over the time period said at least a portion of said material is subjected to said pulsed laser; said pulsed laser having a pulse period of about 0.1 femtoseconds to 1 second, preferably said pulsed laser having a pulse period of about 0.1 nanosecond to 1 microsecond, more preferably said pulsed laser having a pulse period of about 1 nanosecond to 100 nanoseconds; preferably said portion of material has an area of about 100 square nanometers to about 1 square meter, more preferably said portion of material has an area of about 1 square micrometers to about 1 cm², most preferably said portion of material has an area of about 100 square micrometers to about 500 square micrometers. Said portion of material may be any geometry including but not limited to rectangular, circular or square. Preferably, said portion of said material is a portion of the material comprising one or more chemical coatings, said one or more chemical coatings each independently comprising a transition metal and an element selected from the group consisting of hydrogen, carbon, nitrogen, oxygen, sulfur, selenium, phosphorous and mixtures thereof, preferably said one or more chemical coatings each independently comprises a transition metal and an element selected from the group consisting of oxygen, sulfur, selenium and mixtures thereof, said one or more chemical coatings each independently comprising at least one of an amorphous, nanocrystalline, microcrystalline or crystalline region, preferably said chemical coatings comprises one or more transition metal dichalcogenides, preferably said one or more transition metal dichalcogenides are selected from the group consisting of $MoS_2$, $WS_2$, $MoSe_2$, $WSe_2$ and mixtures thereof.

Applicants disclose the process of paragraphs twenty-six through thirty-seven wherein, said material comprises a chemical coating having a thickness of from about 0.1 nanometers to about 1 centimeter, preferably said material comprises a chemical coating having a thickness of from about 0.3 nanometers to about 10 micrometers.

Applicants disclose the process of paragraphs twenty-six through thirty-eight wherein, said electrical and/or optical component is selected from the group consisting of an inductor, a capacitor, a resistor, a diode, a transistor, a trace, a battery, an optical filter, a chemical sensor, a biological sensor and a solar cell.

Applicants disclose the process of paragraphs twenty-six through thirty-nine wherein each of said one or more chemical coatings have an area and a thickness and said removal of said at least a portion of said one or more chemical coating occurs, said removal comprising at least one of:

a.) laser ablation removal of from about 0.1% to about 99.9% of at least one of said one or more chemical coatings' area, preferably said removal comprising laser ablation removal of from about 2% to about 98% of at least one of said chemical coatings' area, more preferably said removal comprising laser ablation removal of from about 10% to about 90% of at least one of said chemical coatings' area; or b.) laser ablation removal of at least 85% of at least one of said chemical coatings' thickness, preferably said removal comprises laser ablation removal of at least 95% of at least one of said chemical coatings' thickness; or laser ablation removal of about 85% to about 99% of at least one of said chemical coatings' thickness.

Applicants disclose the process of paragraphs twenty-six through forty, said process being a roll process wherein said material is a rolled material that is unrolled at least in part, said unrolled portion of said material being at least in part pattern illumination-based annealed, preferably said roll process is a continuous process, more preferably said roll process is a roll to roll process wherein said material is unrolled at least in part, said unrolled portion being, at least in part, pattern illumination-based annealed and rerolled, preferably is material is a rolled chemically coated substrate that is unrolled at least in part, said unrolled chemical coating portion of said coated substrate being at least in part pattern illumination-based annealed, preferably said roll process is a continuous process, more preferably said roll process is a roll to roll process wherein said coated substrate is unrolled at least in part, said unrolled portion being, at least in part, pattern illumination-based annealed and rerolled.

Applicants disclose a process of making electrical device, an optical device or a combined electrical and optical device, said process comprising combining:

a) two or more electrical, an optical or a combined electrical and optical components produced according to the process of paragraphs twenty-six through forty-one; or b) at least one electrical, optical or combined electrical and optical component produced according to the process of paragraphs twenty-six through forty-one, and one or more additional electrical, optical or combined electrical and optical components. Said one or more additional electrical, optical or combined electrical and optical components are not produced according to the processes of paragraphs twenty-six through forty-one.

Applicants disclose an electrical device, an optical device or a combined electrical and optical device:

a) on, within or on and within at least one material that comprises two or more regions that are amorphous, nanocrystalline, microcrystalline or crystalline with the proviso that at least two of said regions are not identical with respect being amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof, or b) on, within or on and within at least one material that comprises at least one region that is amorphous, nanocrystalline, microcrystalline or crystalline, said at least one material comprising a transition metal and an element selected from the group consisting of hydrogen, carbon, nitrogen, oxygen, sulfur, selenium, phosphorous and mixtures thereof;

said electrical device, an optical device or a combined electrical and optical device being produced according to the process of paragraphs twenty-six through forty-one.

Suitable amorphous, nanocrystalline, microcrystalline and/or crystalline materials comprising a transition metal and hydrogen, carbon, nitrogen, oxygen, sulfur, selenium, tellurium, and/or phosphorous can be obtained from Plasmaterials (2268 Research Drive, Livermore, CA 94550 USA) and Kurt Lesker (1925 Route 51, Jefferson Hills, PA 15025 USA.

Suitable continuous wave lasers for conducting Applicants can be obtained from Thorlabs (56 Sparta Avenue, Newtown, NJ 07860 USA), Coherent (5100 Patrick Henry Dr., Santa Clara, CA 95054 USA), and TLM Laser Ltd (Navigation Court, Harris Business Park, Stoke Prior, Bromsgrove, Worcestershire, B60 4FD UK). Pulsed lasers suitable for the applications described here include the Keyence MDX series of laser models obtained from Keyence Corporation (720 South Colorado Boulevard, Suite 650-S Denver, Colorado 80246A) which is capable of a selected range of pulse lengths between microseconds to milliseconds. Lasers with femtosecond and picosecond pulse widths suitable for the applications described here are available from Control Micro Systems (CMS) Laser (4420-A Metric Drive Winter Park, FL 32792). Lamps with characteristics suitable for the applications described here include the Pulse Forge 3300 model by manufactured by Novacentrix (400 Parker Dr. Suite 1110, Austin, TX).

Devices Comprising Electronic and/or Optical Components

The components for electronic and optical devices that are made by Applicants' process can be used in a variety of electronic and optical devices. In general such electronic and optical devices are produced by incorporating one or more of the components made by Applicants' processes into the subject electronic and/or optical devices. Suitable ways of incorporating current components, made by processes other than Applicants' processes, are provided in U.S. Pat. No. 3,138,743 that relates to miniaturized electronic circuits, U.S. Pat. No. 5,515,241 that relates connecting integrated circuits and U.S. Pat. No. 5,526,280 that relates to a gas sensor circuit.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 2A:
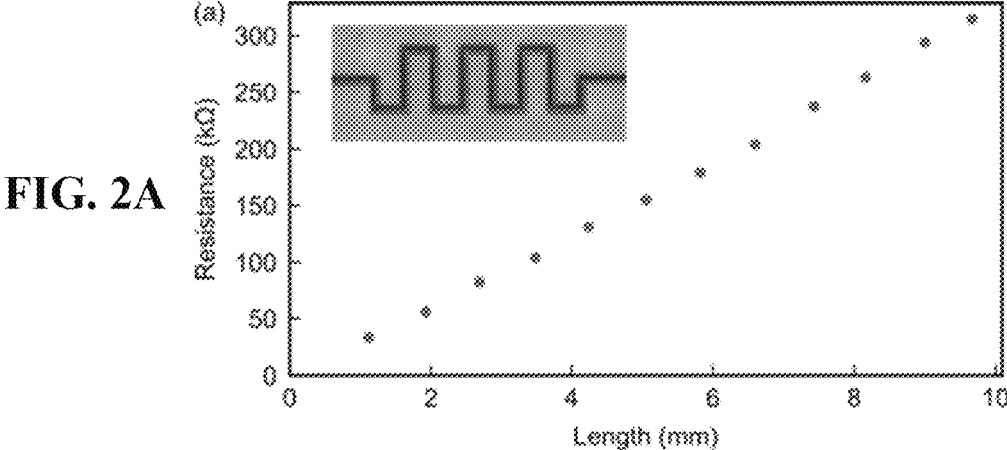
FIG. 2A depicts a laser written resistor and the change in resistance as the length of the line is increased.
Figure 2B:
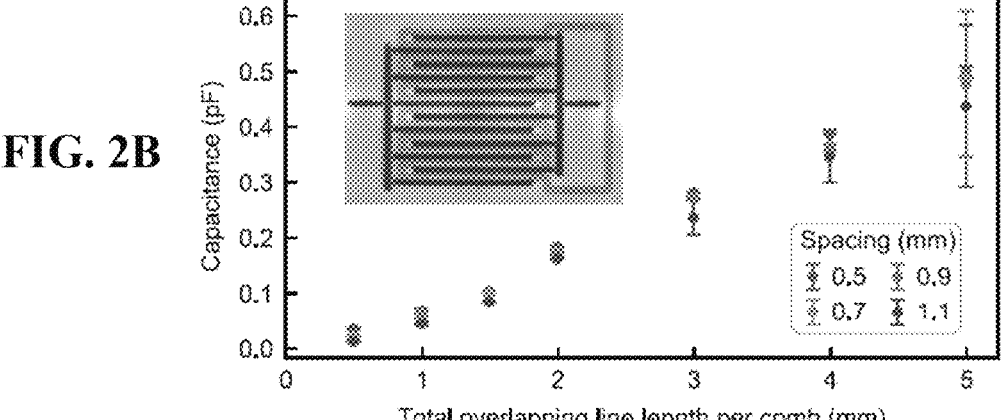
FIG. 2B depicts a comb capacitor and the range in device capacitance achievable based on the capacitor length and design.

Example 1: Laser Written resistor and capacitor in thin film molybdenum disulfide. A molybdenum disulfide ($MoS_2$) thin film of thickness totaling 900±50 nm was deposited onto a glass or $SiO_2$ wafer via magnetron sputtering using a 99.95% pure $MoS_2$ target. Deposition at room temperature resulted in an amorphous film (referred to as a-$MoS_2$) comprised of pure $MoS_2$ and little to no evidence of crystalline structure. Exposure of the a-$MoS_2$ to the laser intensities between 1 and 12 $kW/cm^2$ and exposure times between 0.01 and 10 seconds resulted in the formation of distinct chemical phases, schematically depicted in FIG. TA. Specifically, the formation of crystalline 2H-$MoS_2$, $MoO_2$, and $MoO_3$ were observed. This is illustrated in FIG. 1B where the normalized Raman signal for distinct peaks associated with each phase are plotted as a function of intensity and exposure time. Each of the points in FIG. 1B correspond to the phase formed at the center of a line written under the specified conditions; further from the center, the intensity is lower and can result in the formation of a separate phase. With the ability to locally create crystalline $MoS_2$, $MoO_2$, and $MoO_3$, patterns utilizing the vastly different electronic properties enabled passive circuit elements to be created. One instance of this was through the direct laser writing of resistors and capacitors using a 514 nm laser and creating conducting $MoO_2$ patterns and insulating $MoO_3$ isolation. Depicted in FIG. 2A, resistance can be controlled in a resistor component by varying the length of conductive material within the amorphous material, with the required $MoO_3$ isolation surrounding. Additionally, comb capacitors shown in FIG. 2B with tailored electronic properties are possible via patterning of the same materials but in different configurations.

Figure 3A:
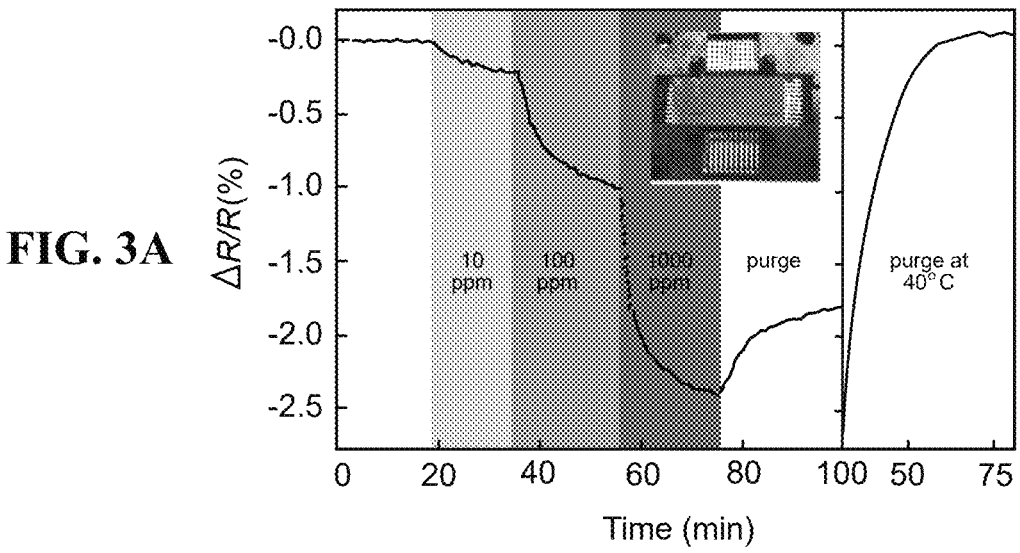
FIG. 3A shows a response from a laser written gas sensor with the inset being an image of the sensor under test.
Figure 3B:
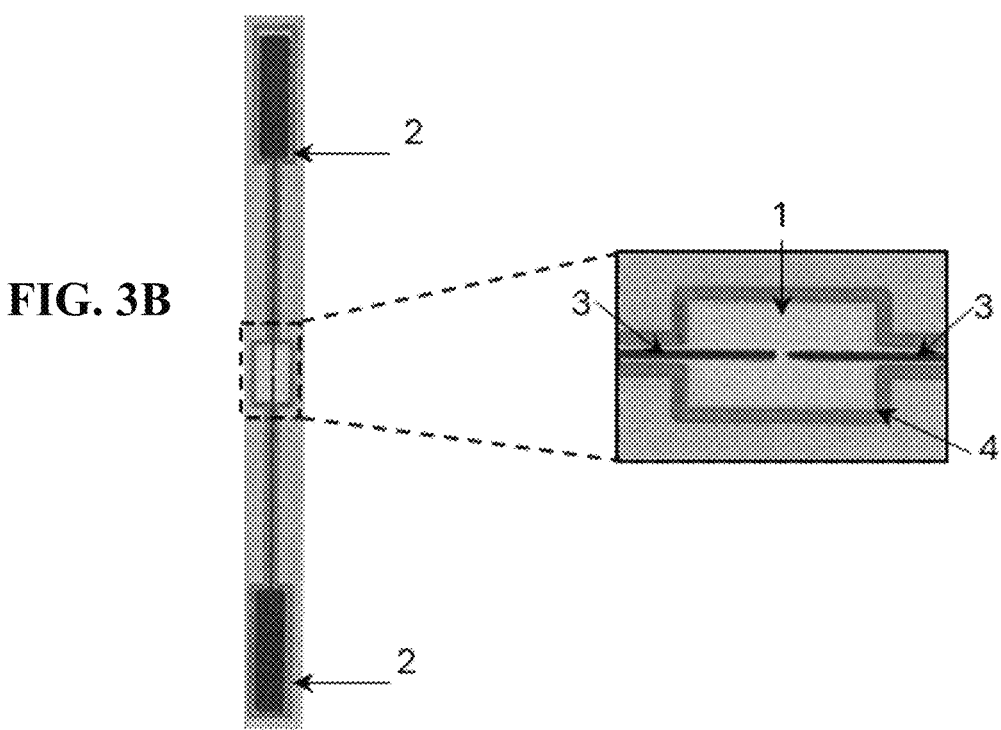
FIG. 3B is an optical image of the laser written sensor, with semiconducting crystalline $MoS_2$ channel (1), $MoO_2$ contact pads (2) and electrodes (3), and a $MoO_3$ boundary isolation (4).

Example 2: Gas sensor laser written in molybdenum disulfide Active circuit elements were also possible using the laser writing technique by taking advantage of the on/off properties of semiconducting 2H-$MoS_2$. One example of this is the laser writing of a chemresistor style gas sensor shown in FIG. 3A and FIG. 3B that can detect ammonia at sub 10 ppm levels. This chemresistor was composed of a semiconducting crystalline $MoS_2$ channel, $MoO_2$ contact pads and electrodes, and a $MoO_3$ boundary isolation, such elements being labeled in FIG. 3B as semiconducting crystalline $MoS_2$ channel (1), $MoO_2$ contact pads (2) and electrodes (3), and a $MoO_3$ boundary isolation (4), and was demonstrated to detect 10, 100, and 1000 parts per million of $NH_3$ gas.

Example 3: The first five materials listed in Column 3 of Table 1 below were made in accordance with Applicants' process using a laser and then the same results were obtained using a lamp. Such materials are useful as listed in Column 5 of Table 1. The last 6 materials listed in Column 3 of Table 1 below are made in accordance with Applicants' process using a laser and then the same results were obtained using a lamp. Such materials are useful as listed in Column 5 of Table 1. The Examples in Table 1 row 1, 2, 5, 9 and 10 of column 4 show a crystalline structure changes in the starting material as represented by 2H, 1T, T-Phase and H-Phase while Examples in Table 1 row 3, 4, 6, 7, 8 and 9 of column 4 show a chemical change in the starting material.

TABLE 1

| Starting Material | Fluid blanket | Methodology | Post-annealed material | Use |
|---|---|---|---|---|
| Amorphous MoS$_2$ | Vacuum | Crystallization | 2H-MoS$_2$ | Semi-conductor |
| | Vacuum | Crystallization | 1T-MoS$_2$ | Conductor |
| | Oxygen gas | Oxidation (Shorter annealing time) | MoO$_2$ | Conductor |
| | Oxygen gas | Oxidation (longer annealing time) | MoO$_3$ | Insulator |
| Amorphous WS$_2$ | Vacuum | Crystallization | 2H-WS$_2$ | Semi-conductor |
| Amorphous TiS | Oxygen gas | Oxidation | TiO | Conductor |
| | Oxygen gas | Oxidation | TiO$_2$ | Semi-conductor |
| | Nitrogen gas | Nitridization | TiN | Conductor |
| Amorphous VS$_2$ | Vacuum | Crystallization | T-phase VS$_2$ | Insulator |
| | Vacuum | Crystallization | H-phase VS$_2$ | Semi-conductor |
| | Oxygen gas | Oxidation | VO2 | Insulator |

Example 4. P-N junction with laser written MoS$_2$/WSe$_2$
Lateral P-N junctions are made possible through patterned amorphous deposition of in-plane heterjunctions of amorphous MoS$_2$/WSe$_2$ structures. With the use of one laser pass across the interface, a n-type semiconductor MoS$_2$ is in contact with a p-type WSe$_2$ semiconductor material, forming a P-N junction of use for light emitting diodes (LEDs) and other optical/electronic components.

Example 5: Sensor device with laser written MoS$_2$ and patterned ablated material. Multiplexed sensor devices require electrical isolation to ensure minimal cross-talk between laser written devices. With this in mind, laser patterned areas of crystallized MoS$_2$ were fabricated and the same laser was used to trace around the area that was annealed to remove all material within that region in creating an electrically isolated circuit. The ablation process removed in total about 1% area of the total MoS$_2$ film.

Figure 4A:
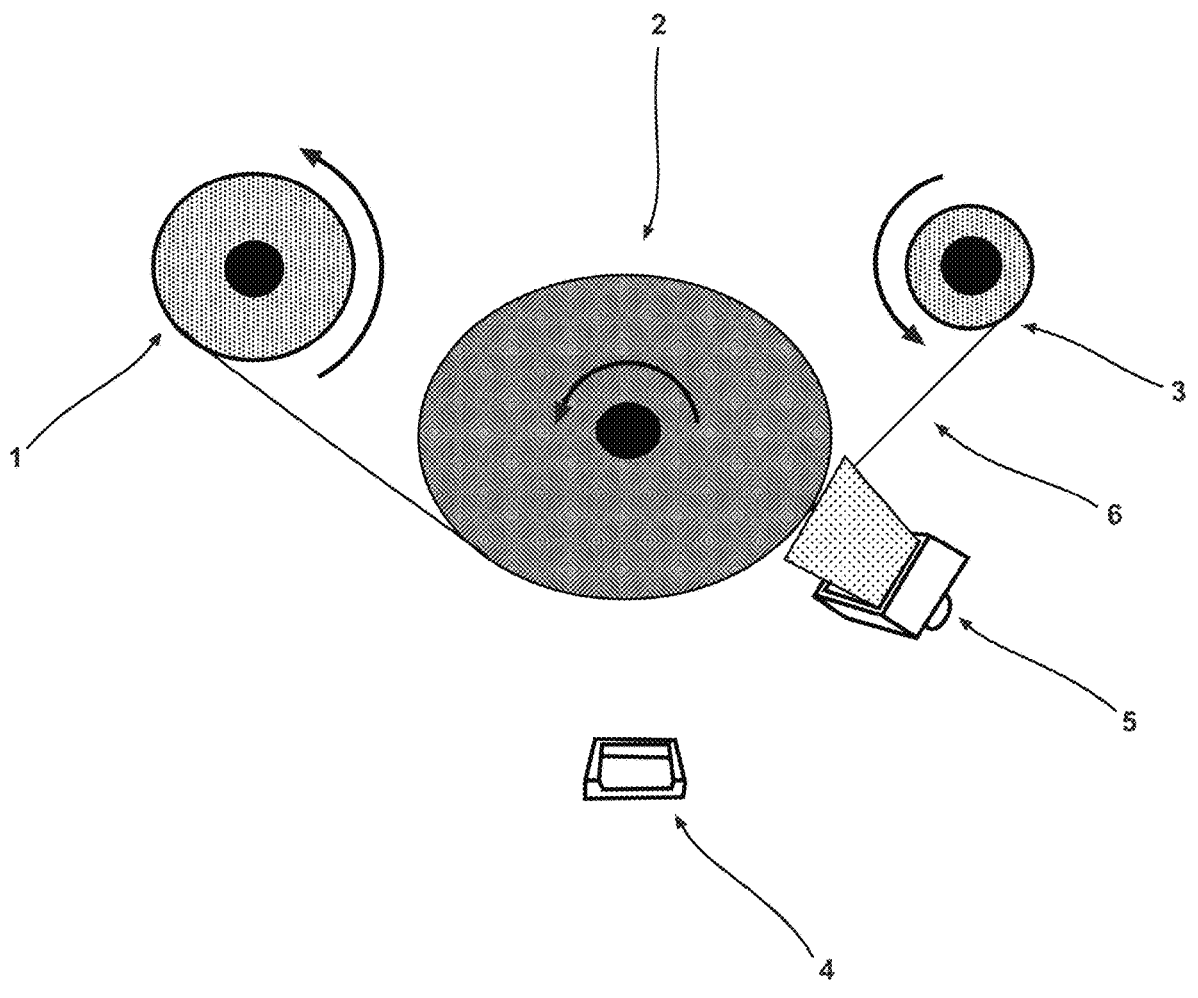
FIG. 4A is an example of the first unit operation in a roll-to-roll deposition of $MoS_2$ onto flexible glass substrates showing Feed roll (1), Main roller (2), Receiving roller (3), Laser (4), $MoS_2$ sputtering target (5) and Flexible glass substrate (6).
Figure 4B:
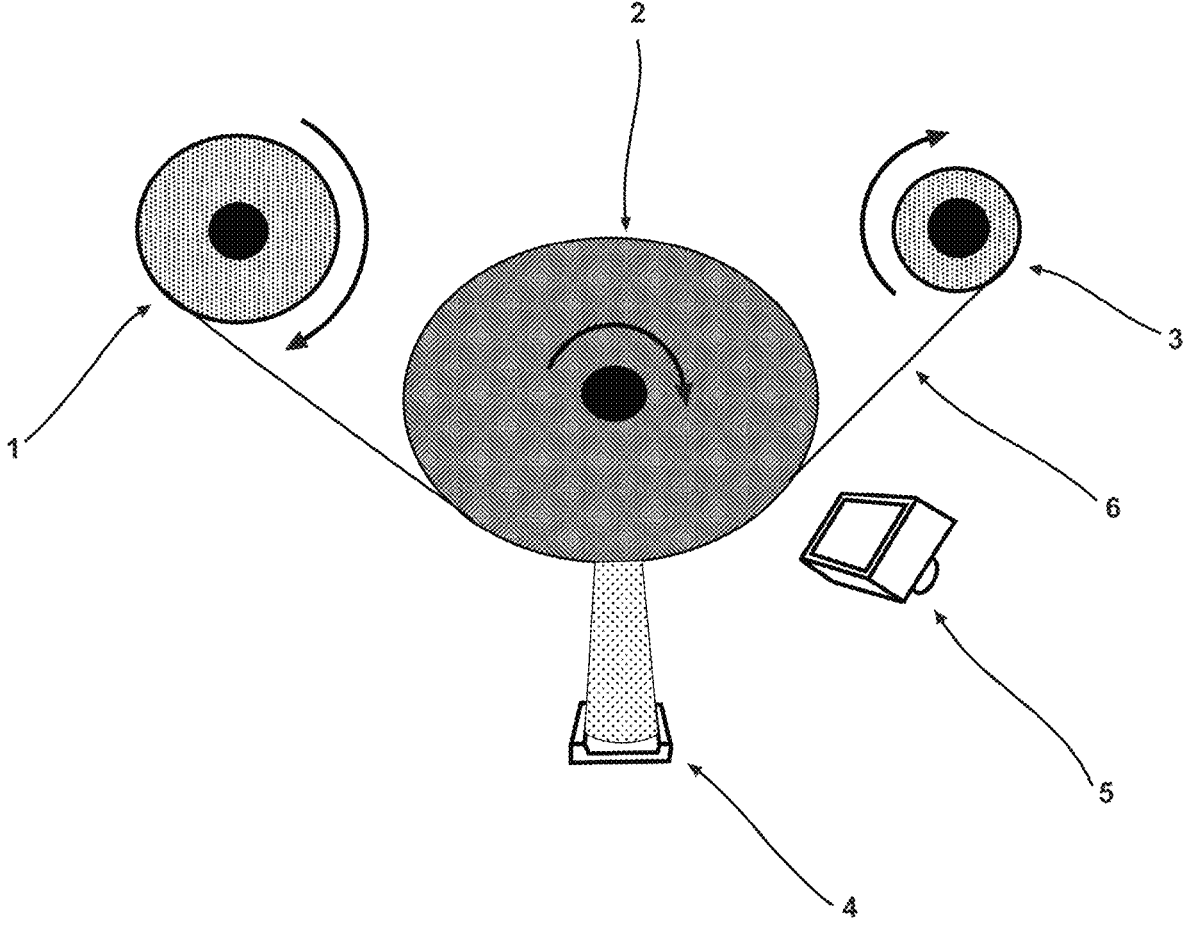
FIG. 4B is an example of the second unit operation in a roll-to-roll deposition of $MoS_2$ onto flexible glass substrates with subsequent laser annealing showing Feed roll (1), Main roller (2), Receiving roller (3), Laser (4), $MoS_2$ sputtering target (5) and Flexible glass substrate (6).
Figure 4C:
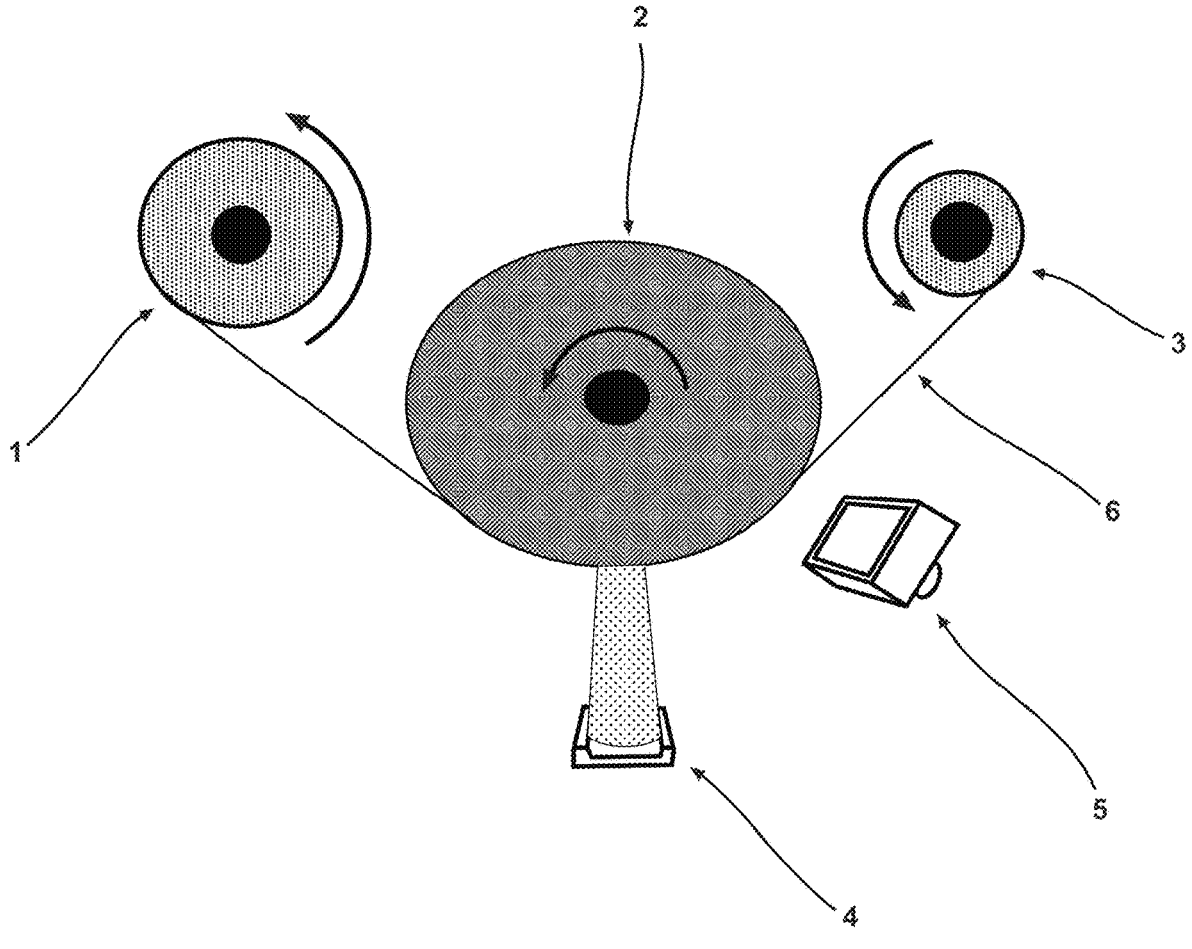
FIG. 4C is an example of the third unit operation in a roll-to-roll deposition of $MoS_2$ onto flexible glass substrates with subsequent laser ablation showing Feed roll (1), Main roller (2), Receiving roller (3), Laser (4), $MoS_2$ sputtering target (5) and Flexible glass substrate (6).

Example 6: All laser written sensor on in roll-to-roll configuration. A roll-to-roll process is utilized to run a spool of flexible glass through a sputter-coater, laser processing system as depicted in FIG. 4. First, a thin layer of molybdenum disulfide is deposited over the entire glass substrate and the laser is used to convert part of the material to MoO$_2$ conductive contacts, with MoS$_2$ in between the contacts and ablation of the surrounding amorphous material. The resultant devices are an embodiment of an all-laser fabrication roll-to-roll approach for chem/bio sensor fabrication.

Example 7: Thick MoS$_2$ film with laser annealing occurring on or within the film to form 3D device. A thick (100 micrometers) amorphous film of MoS$_2$ is deposited onto a glass substrate. A sensor device is laser annealed into the film occur in several stepwise procedures both at the surface of the film and within the depth. First, an area of the film outside of the active device area is laser ablated where the entirety of the film is removed in select areas. Within the remaining film, a focused nanosecond laser is used to crystallize the surface of MoS$_2$ (<1 micrometer) for the active region of the sensor, leaving the remaining 99% within the thickness unaltered. Then, a continuous wave laser is used to oxidize regions of the film through the entire thickness in order to form conductive MoO$_2$ as contact materials to the sensor device.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and process, and illustrative examples shown and described. Accordingly, departures may be made from such details without departing from the scope of the general inventive concept.

What is claimed is:

1. A process of making an electrical component, an optical component or a combined electrical and optical component, said process comprising:
   pattern illumination-based annealing at a intensity and for a time, at least one material that comprises, prior to said annealing, two or more regions that are amorphous, nanocrystalline, microcrystalline, or crystalline, with the proviso that at least two of said regions are not identical with respect being amorphous, nanocrystalline, microcrystalline, or crystalline, said at least one material comprising a transition metal and an element selected from the group consisting of hydrogen, carbon, nitrogen, oxygen, sulfur, selenium, phosphorous and mixtures thereof, using a laser or lamp, to form on, within, or on and within said material:
   (i) at least two electronic elements selected from a conductor, semiconductor and an insulator;
   (ii) two or more different conductors having at least one of the following: different electrical properties or different optical properties;
   (iii) two or more different semiconductors having at least one of the following: different electrical properties or different optical properties; or
   (iv) two or more different insulators having at least one of the following: different electrical properties or different optical properties;
   said process being performed under one of the following conditions: vacuum of less than 100 torr, air, or under a fluid blanket other than air;
   said pattern illumination-based annealing resulting in at least one of a chemical change or structural change, or the removal of material, in at least one of said materials that results in an electrical component, an optical component or a combined electrical and optical component being created to form on, within, or on and within said material.

2. The process of claim 1 wherein said at least one material is a single material.

3. The process of claim 1 wherein said transition metal is selected from the group consisting of: molybdenum, tungsten, niobium, tantalum, vanadium, titanium, chromium, iron, rhodium, hafnium, rhenium, and mixtures thereof.

4. The process of claim 1 wherein said process is performed under a fluid blanket other than air, and said fluid blanket comprises:

a) an element selected from the group consisting of krypton, xenon, radon, argon, neon, helium, hydrogen, carbon, nitrogen, oxygen, sulfur, selenium, phosphorous and mixtures thereof, b) based on total fluid volume greater than 0% to about 19% or from 21% to 100% oxygen; and/or c) greater than 0% to about 78% or from 80% to 100% nitrogen.

5. A process according to claim 1 wherein said two or more regions are nanocrystalline, microcrystalline, or crystalline.

6. The process of claim 1 wherein, said material comprises one or more chemical coatings, said one or more chemical coatings each independently comprising one or more transition metal dichalcogenides selected from the group consisting of $MoS_2$, $WS_2$, $MoSe_2$, $WSe_2$ and mixtures thereof.

7. The process of claim 1 wherein, said material comprises a substrate having a first side and a second side and one or more chemical coatings disposed on said substrate's first side and disposed on said substrate's second side, said one or more chemical coatings each independently comprising a transition metal and an element selected from the group consisting of hydrogen, carbon, nitrogen, oxygen, sulfur, selenium, phosphorous and mixtures thereof, said substrate of said coated substrate being selected from glass, polymer and mixtures thereof.

8. A process according to claim 1 wherein said pattern illumination-based annealing is achieved by using one or more lasers, said one or more lasers each being independently selected from a laser that is a pulsed laser, a continuous laser or a pulsed/continuous laser.

9. A process according to claim 1 wherein said pattern illumination-based annealing is achieved by using a pulsed laser to subject at least a portion of said material for a time of about 0.1 femtoseconds to 60 seconds to said pulsed laser; said pulsed laser having a peak power of from about 0.1 microwatt to about 1000 gigawatts over the time period said at least a portion of said material is subjected to said pulsed laser; said pulsed laser having a pulse period of about 0.1 femtoseconds to 1 second, said portion of said material being a portion of the material comprising one or more chemical coatings, said one or more chemical coatings each independently comprising a transition metal and an element selected from the group consisting of hydrogen, carbon, nitrogen, oxygen, sulfur, selenium, phosphorous and mixtures thereof.

10. The process of claim 1 wherein, said electrical and/or optical component is selected from the group consisting of an inductor, a capacitor, a resistor, a diode, a transistor, a trace, a battery, an optical filter, a chemical sensor, a biological sensor and a solar cell.

11. The process of claim 6 wherein each of said one or more chemical coatings have an area and a thickness and said removal of said at least a portion of said one or more chemical coating occurs, said removal comprising at least one of:

a.) laser ablation removal of from about 0.1% to about 99.9% of at least one of said one or more chemical coatings' area; or b.) laser ablation removal of at least 85% of at least one of said chemical coatings' thickness.

12. The process of claim 1, said process being a roll process wherein said material is a rolled material that is unrolled at least in part, said unrolled portion of said material being at least in part pattern illumination-based annealed.

13. A process of making electrical device, an optical device or a combined electrical and optical device, said process comprising combining:

a) two or more electrical, an optical or a combined electrical and optical components produced according to the process of claim 1; or b) at least one electrical, optical or combined electrical and optical component produced according to the process of claim 1, and one or more additional electrical, optical or combined electrical and optical components.

14. An electrical device, an optical device or a combined electrical and optical device produced by the process of claim 1, wherein said at least one material comprises a transition metal and an element selected from the group consisting of hydrogen, carbon, nitrogen, oxygen, sulfur, selenium, phosphorous and mixtures thereof.

15. The process of claim 2 wherein said single material is a single substrate or film, and said process provides multiple functions that are integrated on, within, or on and within said single substrate or film.

16. The process of claim 1 wherein said pattern illumination-based annealing results in a change in the molecular composition in a region of at least one of said materials that results in an electrical component, an optical component or a combined electrical and optical component being formed on, within or on and within said material.

17. The process of claim 16 wherein the transition metal is Mo, and the element is oxygen, and the process forms different oxide phases $MoO_2$ and $MoO_3$ on, within, or on and within said material.

18. The process of claim 3 wherein said transition metal is selected from the group consisting of: niobium, tantalum, vanadium, titanium, chromium, iron, rhodium, hafnium, rhenium, and mixtures thereof.

19. The process of claim 10 wherein said electrical and/or optical component is selected from the group consisting of: an inductor, a capacitor, a resistor, a diode, a trace, a battery, an optical filter, a chemical sensor, a biological sensor, and a solar cell.

20. The process of claim 19 comprising an electrical component selected from the group consisting of: an inductor, a capacitor, a resistor, a chemical sensor, and a biological sensor.

* * * * *